United States Patent
Hurich

(10) Patent No.: US 6,684,291 B2
(45) Date of Patent: Jan. 27, 2004

(54) INTERFACE FOR A MEMORY, AND METHOD FOR VARIABLE CONFIGURATION OF A MEMORY APPARATUS

(75) Inventor: Martin Hurich, Vaihingen (DE)

(73) Assignee: Robert Bosch GmbH, Stuttgart (GB)

( * ) Notice: Subject to any disclaimer, the term of this patent is extended or adjusted under 35 U.S.C. 154(b) by 32 days.

(21) Appl. No.: 10/026,749

(22) Filed: Dec. 20, 2001

(65) Prior Publication Data
US 2002/0093850 A1 Jul. 18, 2002

(30) Foreign Application Priority Data
Dec. 22, 2000 (DE) ......................................... 100 64 649

(51) Int. Cl.[7] ............................................. G06F 12/00
(52) U.S. Cl. ..................... 711/103; 711/170; 711/171; 711/172; 711/201; 711/202; 711/212
(58) Field of Search ............................. 711/103, 201, 711/202, 209, 212, 170–173

(56) References Cited

U.S. PATENT DOCUMENTS

| | | | | |
|---|---|---|---|---|
| 5,822,781 A | * | 10/1998 | Wells et al. | ................ 711/171 |
| 5,982,572 A | * | 11/1999 | Dahlerud | .................. 360/72.2 |
| 6,035,384 A | * | 3/2000 | Tuma et al. | ................. 711/219 |
| 6,081,878 A | * | 6/2000 | Estakhri et al. | ............. 711/168 |
| 6,173,385 B1 | * | 1/2001 | Tuma et al. | ................. 711/219 |
| 6,223,308 B1 | * | 4/2001 | Estakhri et al. | ............... 714/42 |

FOREIGN PATENT DOCUMENTS

DE 197 82 214 2/2000

* cited by examiner

Primary Examiner—Mano Padmanabian
Assistant Examiner—Jasmine Song
(74) Attorney, Agent, or Firm—Kenyon & Kenyon

(57) ABSTRACT

A memory including a plurality of memory cells combined into multiple physical sectors, in which the memory cells combined into one physical sector are capable of being erased only together, and in which the interface includes interrogation apparatus, arrangement, and structure that interrogates memory data encompassing sector data, and an allocation apparatus, arrangement, and structure that, incorporating the sector data, allocates multiple memory cells to each logical block, and in which allocation of the memory cells to the respective logical blocks is performed based on application-specific and/or memory-specific block data conveyed to the interface, which are represented by block information data that can be modified independently of data that constitute a program code. A method for providing variable configuration of a memory apparatus that includes at least one memory, and an apparatus for carrying out that method.

18 Claims, 2 Drawing Sheets what # INTERFACE FOR A MEMORY, AND METHOD FOR VARIABLE CONFIGURATION OF A MEMORY APPARATUS

FIELD OF THE INVENTION

The present invention relates to an interface for at least one memory, in particular a flash memory, including a plurality of memory cells combined into multiple physical sectors, in which the memory cells combined into one physical sector are capable of being erased only together, and in which the interface includes an interrogation apparatus, arrangement, or structure to interrogate (flash) memory data that encompass sector data, and an allocation apparatus, arrangement, or structure that, incorporating the sector data, allocates multiple memory cells to each logical block.

The present invention also relates to a method for providing variable configuration of a memory apparatus that includes at least one memory, in particular a flash memory, which includes a plurality of memory cells that are combined into multiple physical sectors, in which the memory cells combined into one physical sector are capable of being erased only together, where the method includes the step of reading in (flash) memory data that include sector data.

The present invention also relates to an apparatus for carrying out or performing the exemplary method of the present invention.

BACKGROUND INFORMATION

In contrast to dynamic random-access memories (DRAM), flash memories, for example, in the form of electrically erasable programmable memories (flash EEPROM) have the advantage that the data stored in them are not lost, even if the power supply is shut off. This property opens up a wide field of applications, for example, using flash memories as replacements for mechanical hard disk drives or in combination with mobile radio terminals. A flash memory may include, for example, floating gate field effect transistor components that are arranged in rows and columns. The charge stored on the floating gate of a transistor of this kind may be modified by suitable programming. The state of this charge, and thus the occupancy of the corresponding memory cell, may be sensed by scanning the corresponding voltage at the component. A line and column addressing system may be used to address a flash memory.

The structure of flash memories may make it impossible to erase individual memory cells, since only individual sectors, in which multiple memory cells are combined, may be erased. This may have a particularly strong impact on the operational behavior of flash memories because the contents of a memory cell may be overwritten only after the corresponding memory cell has been erased. For this reason, the contents of all memory cells that are occupied and are not intended to be overwritten must be stored in a sector in another region of the memory as soon as one or more memory cells in that sector need to be overwritten. It therefore may take much longer to write data into a flash memory than into a DRAM. In order to reduce the effects of this disadvantage, it is understood that write buffers may be arranged on the same IC as the flash memory itself.

In order to manage flash memories, the interface for the corresponding flash memories may allocate multiple memory cells to respective logical blocks. The interface can be provided on the same IC as the flash memory array, or separately therefrom.

Regardless of the specific configuration of the interface, in many applications it may be desirable to replace the flash memories, for example, with flash memories having a greater capacity. In such a case, a problem may arise since the interface may not be readily compatible with different flash memories, so that replacement or updating of the interface may also be necessary. To solve this problem, German Published Patent Application No. 197 82 214 relates to a component that contains a memory array, an interrogation memory, and an interface. The memory array contains a plurality of blocks of flash EEPROM memory components that are arranged so that they may be accessed in rows and columns. An interrogation memory stores data that define the characteristics of the flash memory component. The interface receives data and commands that are addressed to the flash memory component. The interface generates signals to implement the commands within the flash memory components. The interface contains a circuit for receiving a command and for answering, which is done by returning the data stored in the interrogation memory as output.

According to one embodiment referred to in German Published Patent Application No. 197 82 214, it may be possible, for example, in a computer system (e.g., a laptop), to use different flash memory components as supplements to or replacements for a hard disk drive. In this case, the interface may be located between a computer bus and the flash memory, and with the aid of the data that define the characteristics of the flash memory component, the interface may ensure that the data interchange, standardized for the particular computer bus, may be performed, irrespective of the particular flash memory component being used.

The interface of German Published Patent Application No. 197 82 214 may make it possible to use different flash memories for one specific application.

SUMMARY OF THE INVENTION

An exemplary interface according to the present invention is directed to provide an allocation of memory cells to respective logical blocks on the basis of application-specific and/or flash memory-specific block data conveyed to the interface. This block data may be modified independently of program code data. A universal interface may be used with a variety of flash memories and for different applications that require a variety of block definitions.

For this purpose, the block data may include block formation data that define which memory cells or physical sectors are allocated to which block.

Since the memory cells contained in a respective sector may only be erased all together, block formation data may be optimized so that as many block boundaries as possible of the logical blocks coincide with sector boundaries of physical sectors.

Nevertheless, one block may completely or partly include one or more physical sectors, so that logical blocks of arbitrary sizes that need not be integral multiples of sector sizes may be formed.

The block data may include block property data that may, for example, define desired utilization limitations.

In this context, the block property data may include, in particular, information as to whether and/or when a logical block or a portion of a logical block is erased and/or enabled for a write access and/or enabled for a read access, so as to for example, provide different read or write prohibitions for routines having different authorizations.

The block data may also include block linkage data that indicate memory regions to which a corresponding logical block may be linked. A logical block or several logical blocks may, for example, be linked to mirroring or protection regions of either the flash memory or another memory, depending on the application.

The flash memory data and/or the block data may be stored in one or more files. In this way, the flash memory data may be stored in one file, while the block data may be stored in another file. If the flash memory is replaced with a different flash memory, it may then be sufficient to simply replace the file that contains the flash memory data. Similarly, with the use of the two separate files, it may be sufficient to replace only the file that contains the block data, if the application changes.

The block data may be modifiable, even during operation of the interface. Since the configuration of physical sectors is predefined in accordance with the flash memory being used, it may be necessary to modify the layout of the logical blocks (i.e. the block formation data) between various revisions of a project, even, for example, within an application. It may also be necessary to modify corresponding block property data. In converting to new block data, the new block data should be compatible with the previously valid block data, so that inadvertent data loss may be prevented, for example.

In addition to the step of reading in (flash) memory data that include sector data, the exemplary method includes the further steps of: b) reading in application-dependent and/or flash memory-dependent block data which are represented by block information data that can be modified independently of data that constitute a program code; and c) forming logical blocks by allocating multiple memory cells to a respective logical block on the basis of the block data that have been read in. Thus, different flash memories may be used for one application, and one flash memory may be used for different applications, with no need to modify program code.

The block data may include block formation data that define which memory cells or physical sectors may be allocated to which logical block, so that the layout of the logical blocks is variable.

If the block formation data are optimized in such a way that as many as possible of the block boundaries of the logical blocks coincide with sector boundaries of the physical sectors, data stored in the flash memory may be modified at a relatively high speed.

Coincidence of the block boundaries of the logical blocks with the sector boundaries of the physical sectors is not, however, absolutely necessary; instead, one logical block may completely or partly encompass one or more physical sectors.

In order, for example, to be able to assign different authorizations to various routines, the block data may include block property data.

These block property data may, in particular, include whether and/or when a logical block or a portion of a logical block is erased and/or enabled for a write access and/or enabled for a read access.

In order to realize mirroring and/or protection functions, for example, the block data may include block linkage data. It may therefore be possible, for example, for particularly important data to be mirrored, i.e., retained in duplicate, for security reasons, in different memory regions or even in different flash memory components, and modified identically in each case.

In conjunction with an exemplary method according to the present invention, the flash memory data and/or the block data may be stored in one or more files. If one file is used for the flash memory data and one file for the block data, it may be sufficient, either in the event of a change in the application or upon replacement of the flash memory, to modify only one file.

An exemplary method according to the present invention may be carried out or performed, even during operation of the flash memory. For example, it may be necessary to modify the layout of the logical block, even though the flash memory already contains data that must not be lost.

An apparatus for carrying out an exemplary method according to the present invention is also provided.

DETAILED DESCRIPTION

Figure 1:
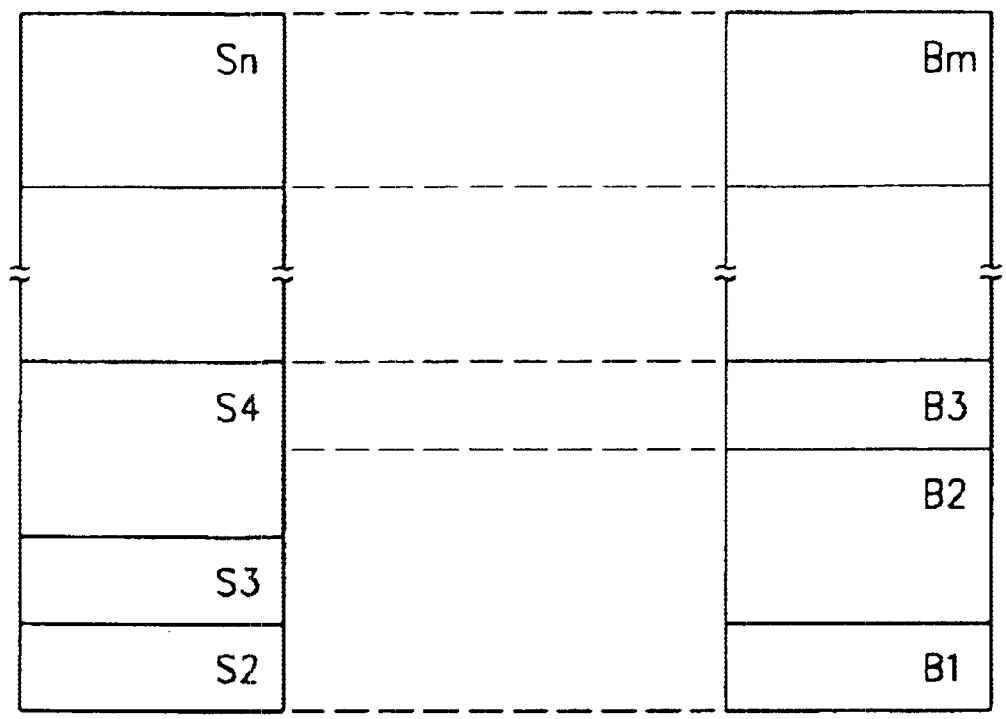
FIG. 1 shows a schematic allocation of physical sectors, and memory cells combined therein, to logical blocks.
Figure 1:

FIG. 1 depicts n sectors of a flash memory, labeled S0, S1, S2, S3, S4, . . . Sn. Each sector contains a plurality (not depicted in further detail) of memory cells. Due to the construction of flash memories, the memory cells contained in each sector S0, S1, S2, S3, S4, . . . Sn may be erased only all at once; further, each memory cell must be erased prior to any modification of its content. On the right side of FIG. 1 are m logical blocks labeled B0, B1, B2, B3, . . . Bm. The flash memory data include sector data that indicate, for example, how many sectors exist and how many memory cells are allocated to each sector. In addition, these data may include information necessary for addressing the memory cells.

The block data includes block formation data that define which memory cells or physical sectors S0, S1, S2, S3, S4, . . . Sn are allocated to which block B0, B1, B2, B3, . . . Bm. In other words, these block formation data include information on how many logical blocks B0, B1, B2, B3, . . . Bm an application may require, and the size of each logical block B0, B1, B2, B3, . . . Bm.

As shown in FIG. 1, logical block B0 includes physical sectors S0 and S1. The lower block boundary of logical block B0 coincides with the lower sector boundary of physical sector S0, while the upper block boundary of logical block B0 coincides with the upper sector boundary of physical sector S1. The memory cells contained in physical sector S2 are mapped onto logical block B1. The block boundaries of logical block B1 coincide with the sector boundaries of physical sector S2.

It may be advantageous to have as many block boundaries as possible coincide with sector boundaries, since this may result, for example, in writing speed advantages.

Coincidence of the block boundaries with the sector boundaries may not be however, absolutely necessary. For example, the memory cells contained in physical sector S3 are mapped onto logical block B2, onto which some of the memory cells of physical sector S4 are mapped. The upper block boundary of logical block B2 therefore does not coincide with a sector boundary of a physical sector.

Thus, the exemplary embodiment results in a hardware encapsulation that, by way of defined interfaces, may guarantee independence from flash memory modules that may be used. Because of the variable layout of logical blocks B0, B1, B2, B3, . . . Bm and the modifiability of their properties, customer-specific functionality may, for example, be provided. Also, for example, differing memory division requirements of various customers may result in differing configuration files, each of which contains flash memory data and block data. This adaptation may also take place at runtime.

The memory region may therefore be defined as a whole, so that the state of the flash memory may be defined unequivocally at any point in time. The layout of the logical blocks, constituting a map of the flash memory, may be replaced at any time with a different layout compatible with the present state. Control of the entire flash memory may therefore not be lost at any point.

Figure 2:
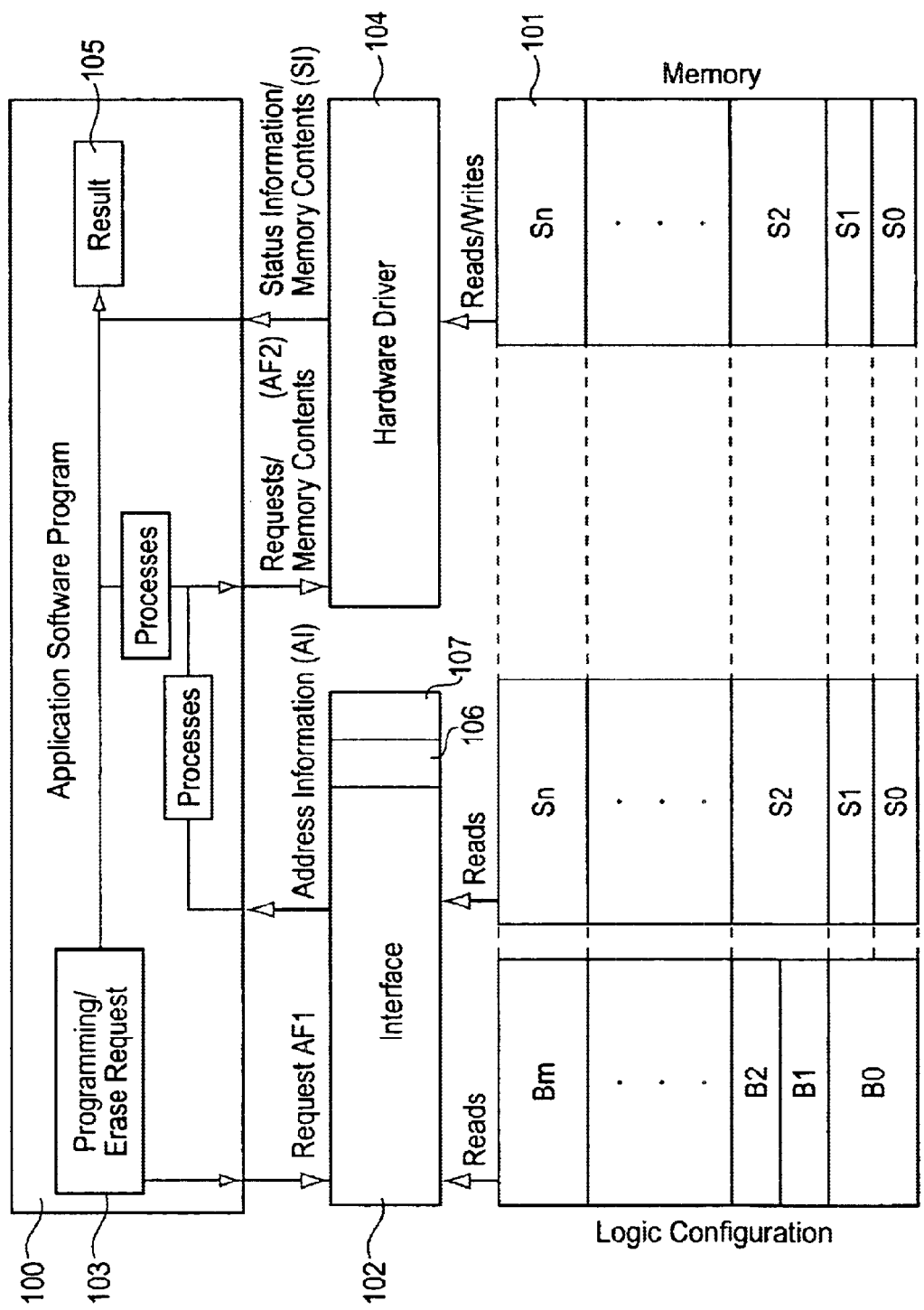
FIG. 2 shows an information-flow-oriented schematic representation of an exemplary interface according to the present invention including a memory, and an exemplary apparatus according to the present invention.

In this context, FIG. 2 depicts n sectors of a flash memory, labeled S0, S1, S2, . . . Sn. Each of these sectors contains a plurality of memory cells (not depicted in further detail). Depicted on the left side of FIG. 2 are m logical blocks, labeled B0, B1, B2, . . . Bm. Except for the allocation of the blocks of logical configuration B0 through Bm and sectors S0 through Sn being modified from that of FIG. 1, the description of FIG. 1 also applies to FIG. 2.

FIG. 2 depicts an application software program 100 including a programming/erase request 103 and a result 105. The application software program 100 sends requests AF1 to the configuration interface 102, which contains the above described allocation arrangement 107 and interrogation arrangement 106. Hardware driver elements 104 receive requests/memory contents AF2, and forwards status information/memory contents SI to the application software program. The data and contents regarding the data exchanged have already been described with reference to FIG. 1.

Execution in terms of information flow is described as follows:

Application software program 100 generates an erase request or programming request via programming/erase block 103. The request may be generated internally by application software program 100 or applied externally, e.g., by a test device, to the software.

Erase or programming request 103 concerns one or more memory cells in flash memory 101, which may lie in one or more physical sectors S0 through Sn. Hardware driver elements 104 may be used to perform write accesses to the flash memory if they are compatible with the physical division of the flash memory into physical sectors (S0 through Sn) and the present state of the memory cells to be modified (erased or programmed).

In order to prevent incorrect modification of memory contents, application software 100 must first check the executability of programming/erase request 103 or AF1. Application software program 100 receives example read methods from interrogation arrangement 106, which are made available as services by configuration interface 102. The read methods enable interrogation of how the memory cells to be modified are allocated to both the physical sectors S0 through Sn of the flash memory and the logical blocks B0 through Bm. With the aid of interrogation apparatus, arrangement, or structure 106, the relevant physical sectors from among S0 through Sn and logical blocks from among B0 through Bm may be ascertained, and their address information may be read from an available configuration. The available configuration is depicted using so-called allocation apparatus, arrangement, or structure 107, as described previously with regard to FIG. 1.

A determination of data via interrogation arrangement 106 thus accesses actual configuration data in encapsulated fashion within configuration interface 102 via allocation apparatus, arrangement, or structure 107.

Application software program 100 can additionally, with the aid of other services, ascertain the status of the relevant physical sectors and logical blocks. Once the combination of these data has been processed, application software program 100 may check the permissibility of programming/erase request 103.

If a request is permissible, application software program 100 can forward the prepared request information AF2 to hardware drivers 104. Request information AF2 includes all the memory cells to be modified, as well as the memory contents to be programmed.

Hardware drivers 104 access the flash memory modules directly and modify the contents of the memory cells in the manner requested. During the write access, the processing status information/memory contents (SI) may be requested by application software program 100. Once the write access is complete, result 105 of the access is returned to application software program 100, i.e., status information/memory contents SI. Result 105 may contain information regarding memory contents, flash module status, and/or fault messages resulting from hardware faults.

Configuration interface 102 makes available write methods that allow application software program 100 to modify the configuration information with the aid of allocation apparatus, arrangement, or structure 107.

Memories such as those described above may be, for example, flash modules or flash memories. The use of memories does not, however, limit the subject matter according to the present invention. Any other suitably appropriate memory having comparable properties is also intended to be considered in this context.

The above description of the exemplary embodiments and/or exemplary methods of the present invention are exemplary. A variety of changes and modifications may fall within the scope of protection of the accompanying claims.

What is claimed is:

1. An interface for at least one flash memory, including memory cells that are combined into a plurality of physical sectors, the memory cells combined into one of the plurality of physical sectors being erasable only together, the interface comprising:

an interrogation arrangement to interrogate memory data, the memory data including sector data; and an allocation arrangement to allocate, based on the sector data, multiple ones of the memory cells to each one of a plurality of logical blocks based on at least one of application-specific block data and memory-specific block data conveyed to the interface, which are represented by block information data that are modifiable independently of data constituting a program code.

2. The interface of claim 1, wherein the block data include block formation data defining one of which memory cells and which physical sectors are allocated to each of the plurality of logical blocks.

3. The interface of claim 2, wherein the block formation data are optimized so that as many as possible of block boundaries of the plurality of logical blocks coincide with sector boundaries of the plurality of the physical sectors.

4. The interface of claim 1, wherein at least one of the plurality of logical blocks at least partially encompasses at least one of the plurality of physical sectors.

5. The interface of claim 1, wherein the block data include block property data.

6. The interface of claim 5, wherein the block property data include information as to whether or when one of the plurality of logical blocks and a portion of the plurality of logical blocks is enabled for a read access, erased, or enabled for a write access.

7. The interface of claim 1, wherein the block data include block linkage data indicating memory regions to which a corresponding one of the plurality of logical blocks is linked.

8. The interface of claim 1, wherein at least one of the memory data and the block data are stored in at least one file.

9. The interface of claim 1, wherein the block data are modifiable during operation of the interface.

10. A method for providing variable configuration of at least one flash memory apparatus, including a plurality of memory cells that are combined into multiple physical sectors, the plurality of memory cells combined into one of the multiple physical sector being erasable only together, the method comprising the steps of:

reading in flash memory data that include sector data;

reading at least one of application-dependent block data and memory-dependent block data that are modifiable independently of data that constituting a program code; and allocating the memory cells to a respective logical block to form logical blocks.

11. The method of claim 10, wherein the block data include block formation data defining which of the plurality of memory cells and which of the plurality of physical sectors are allocated to which of the logical blocks.

12. The method of claim 11, wherein the block formation data are optimized so that as many as possible of the block boundaries of the logical blocks coincide with sector boundaries of the plurality of physical sectors.

13. The method of claim 10, wherein at least one of the logical blocks at least partly encompasses at least one of the plurality of physical sectors.

14. The method of claim 10, wherein the block data include block property data.

15. The method of claim 14, wherein the block property data include information as to whether or when one of the plurality of logical blocks and a portion of the plurality of logical blocks is enabled for a read access, erased, or enabled for a write access.

16. The method of claim 10, wherein the block data include block linkage data indicating memory regions to which a corresponding one of the plurality of logical blocks is linked.

17. The method of claim 10, wherein at least one of the memory data and the block data are stored in at least one file.

18. An interface for at least one flash memory, including memory cells that are combined into a plurality of physical sectors, the memory cells combined into one of the plurality of physical sectors being erasable only together, the interface comprising:

an interrogation arrangement to interrogate memory data, the memory data including sector data; and an allocation arrangement to allocate, based on the sector data, multiple ones of the memory cells to each one of a plurality of logical blocks based on at least one of application-specific block data and memory-specific block data conveyed to the interface, which are represented by block information data that are modifiable independently of data constituting a program code;

wherein a given physical sector may correspond to more than one logical block of the plurality of logical blocks.

* * * * *